US009818862B2

(12) United States Patent
Gao et al.

(10) Patent No.: US 9,818,862 B2
(45) Date of Patent: Nov. 14, 2017

(54) SEMICONDUCTOR DEVICE WITH FLOATING FIELD PLATES

(71) Applicant: FREESCALE SEMICONDUCTOR, INC., Austin, TX (US)

(72) Inventors: Zihao M. Gao, Austin, TX (US); David C. Burdeaux, Austin, TX (US); Wayne Robert Burger, Austin, TX (US); Christopher P. Dragon, Austin, TX (US); Hernan A. Rueda, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/987,792

(22) Filed: Jan. 5, 2016

(65) Prior Publication Data

US 2017/0194488 A1    Jul. 6, 2017

(51) Int. Cl.
*H01L 29/78* (2006.01)
*H01L 29/06* (2006.01)
*H01L 29/40* (2006.01)
*H01L 29/66* (2006.01)

(52) U.S. Cl.
CPC ...... *H01L 29/7823* (2013.01); *H01L 29/0619* (2013.01); *H01L 29/0692* (2013.01); *H01L 29/404* (2013.01); *H01L 29/66681* (2013.01)

(58) Field of Classification Search
CPC ............ H01L 29/7823; H01L 29/0619; H01L 29/0649; H01L 29/0882; H01L 29/0886; H01L 29/404; H01L 29/41758
See application file for complete search history.

(56) References Cited

U.S. PATENT DOCUMENTS

| | | |
|---|---|---|
| 5,075,739 A | 12/1991 | Davies |
| 5,629,552 A | 5/1997 | Zommer |
| 6,376,890 B1 | 4/2002 | Tihanyi |
| 6,468,837 B1 | 10/2002 | Pendharkar et al. |
| 6,525,389 B1 | 2/2003 | Ahmed |
| 6,563,197 B1 | 5/2003 | Wagers et al. |
| 6,924,531 B2 | 8/2005 | Chen et al. |
| 7,026,650 B2 | 4/2006 | Ryu et al. |
| 7,391,093 B2 | 6/2008 | Watanabe et al. |
| 7,525,178 B2 | 4/2009 | Kulinsky |
| 8,476,691 B1 | 7/2013 | Sdrulla et al. |
| 8,643,135 B2 | 2/2014 | Bobde et al. |
| 8,802,529 B2 | 8/2014 | Yilmaz et al. |
| 9,324,816 B2 * | 4/2016 | Matsudai ............ H01L 29/0619 |
| 2013/0168765 A1 | 7/2013 | Lin et al. |

* cited by examiner

*Primary Examiner* — Jose R Diaz
(74) *Attorney, Agent, or Firm* — David G. Dolezal

(57) ABSTRACT

A semiconductor device with a current terminal region located in a device active area of a substrate of the device. A guard region is located in a termination area of the device. A plurality of floating field plates are located in the termination area and are ohmically coupled to the guard region. The floating field plates and guard region act in some embodiments to "smooth" the electrical field distribution along the termination area.

21 Claims, 10 Drawing Sheets

SEMICONDUCTOR DEVICE WITH FLOATING FIELD PLATES

BACKGROUND OF THE INVENTION

Field of the Invention

This invention relates in general to floating field plates for a guard structure in a termination area of a semiconductor device.

Description of the Related Art

Some transistors such as laterally diffused MOS (LDMOS) transistors, can be used in high voltage circuits such as in RF power amplifiers. For example, with some implementations, the voltage differential between terminals of an LDMOS transistor can exceed 200 Volts.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

Figure 1:
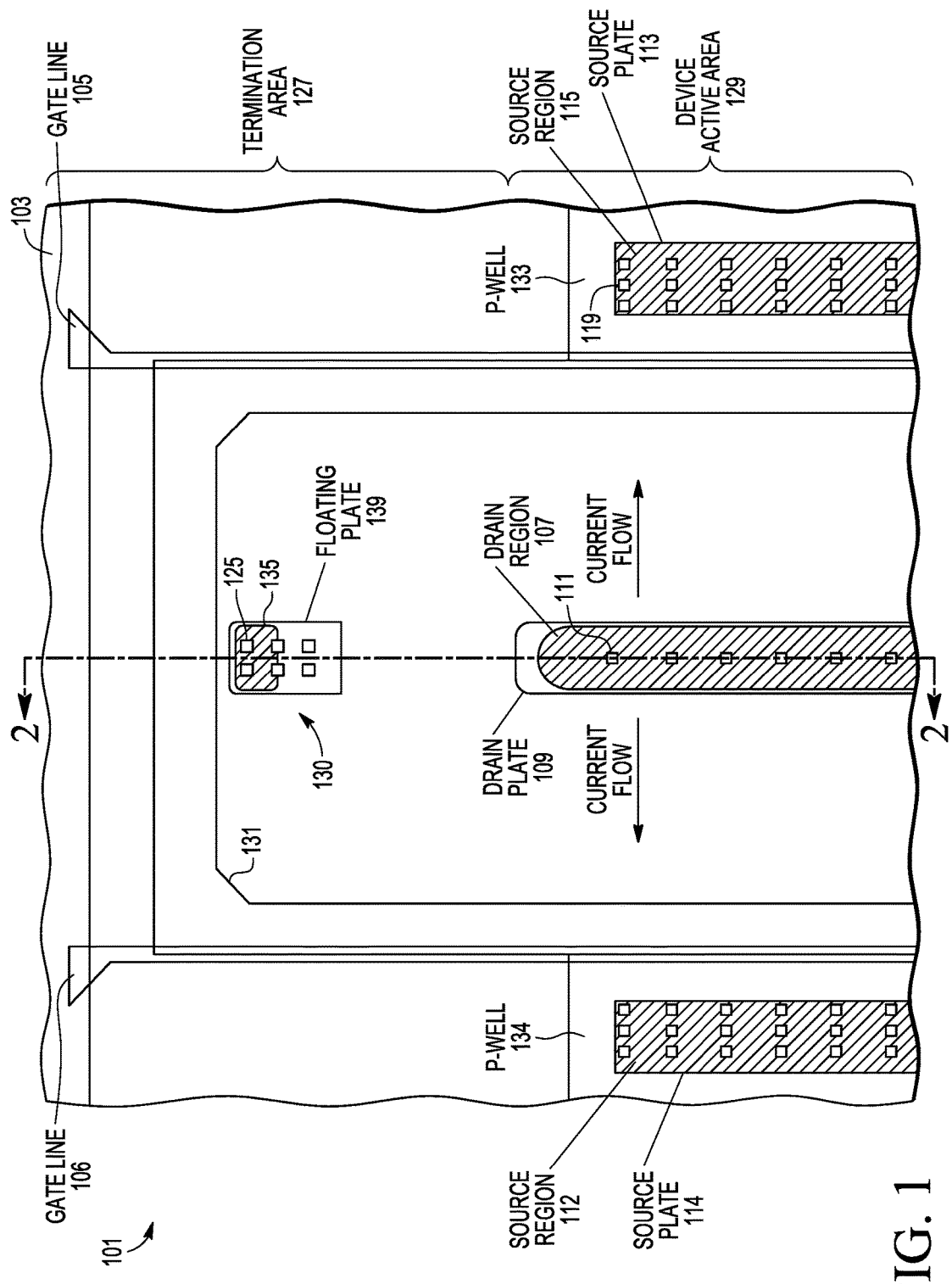
FIG. 1 is a partial top view of a portion of a semiconductor device according to one embodiment of the present invention.

The following sets forth a detailed description of a mode for carrying out the invention. The description is intended to be illustrative of the invention and should not be taken to be limiting.

In some embodiments, a semiconductor device includes a guard structure having a guard region and multiple floating field plates located in a termination area of the semiconductor device. In one embodiment, such a guard structure may provide the termination area with a higher current avalanche capability. The multiple floating field plates are ohmically coupled to the guard region in the semiconductor substrate. In some embodiments, the use of multiple, stepped floating field plates acts to smooth the electrical field distribution in the termination area between the drain terminal and peripheral areas of the semiconductor device. Furthermore, the use of field plates in a guard structure may provide for more metal surface coverage against external charged contaminants activated by high temperature and high stress conditions. Furthermore, implementing field plates in the guard structure may enable a designer to control the breakdown characteristics of a terminal region of a device by adjusting the distance between the distal end of the drain region and the ground edge of the termination area of the device.

Some semiconductor devices include active areas and field areas (non active areas). With some semiconductor devices, an active area includes a device active area, which is the area of the current terminal regions of a device (e.g. source region, drain region of a transistor) and the regions of desired carrier mobility between the current terminal regions (e.g. channel region, drift region of a transistor). A field area includes those areas at the peripheral of the device where dielectric structures are located at the surface of the semiconductor substrate. Some semiconductor devices also include termination areas that are transition or linkage areas from the active areas to the field areas. A termination area includes regions of the active area where there is no desired carrier conductivity during operation and includes areas of the field areas adjacent to the active regions.

With some transistors, the goal of termination area design is to provide a termination area with superior current avalanche capability while a goal of device active area design is to achieve a balance between optimal levels of Rds(on) (resistance (drain-to source) during activation) and blocking voltage (BVDSS) (the maximum voltage that can be applied to a MOSFET). For some high power applications, a robust termination area in an RF LDMOS transistor is particularly important since thermal runaway during Unclamped Inductive Switching (UIS) conditions requires uniform thermal dissipation in device active regions in order to achieve better single pulse avalanche energy. Hot spots in some termination areas (e.g. from non uniform electrical field distributions) are not desirable due to a limited space in those areas to absorb large amounts of thermal energy. In the case of high avalanche capable termination in some embodiments, a device design philosophy is to let avalanche occur in the device active area due to the fact that the device active area has larger area to absorb more heat than a smaller termination area, thus to improve UIS capability.

It has been observed that devices with lower BVDSS have better UIS performance while devices with higher BVDSS have worse UIS performance. In some devices with relatively lower BVDSS, both termination and device active areas have comparable amounts of leakage current at avalanche conditions resulting in consistent heating in both areas, thus providing for better UIS performance. In the case of higher BVDSS, avalanche is restricted by the termination area due to its low BVDSS capability, causing avalanche in the relatively smaller termination area and thus poorer UIS performance.

In some embodiments, providing a termination area with higher avalanche capability than that of the device active area causes the avalanche to occur in the device active area and not in the termination area. This may improve UIS performance due to the fact that the larger device active area can absorb more thermal energy.

Figure 2:
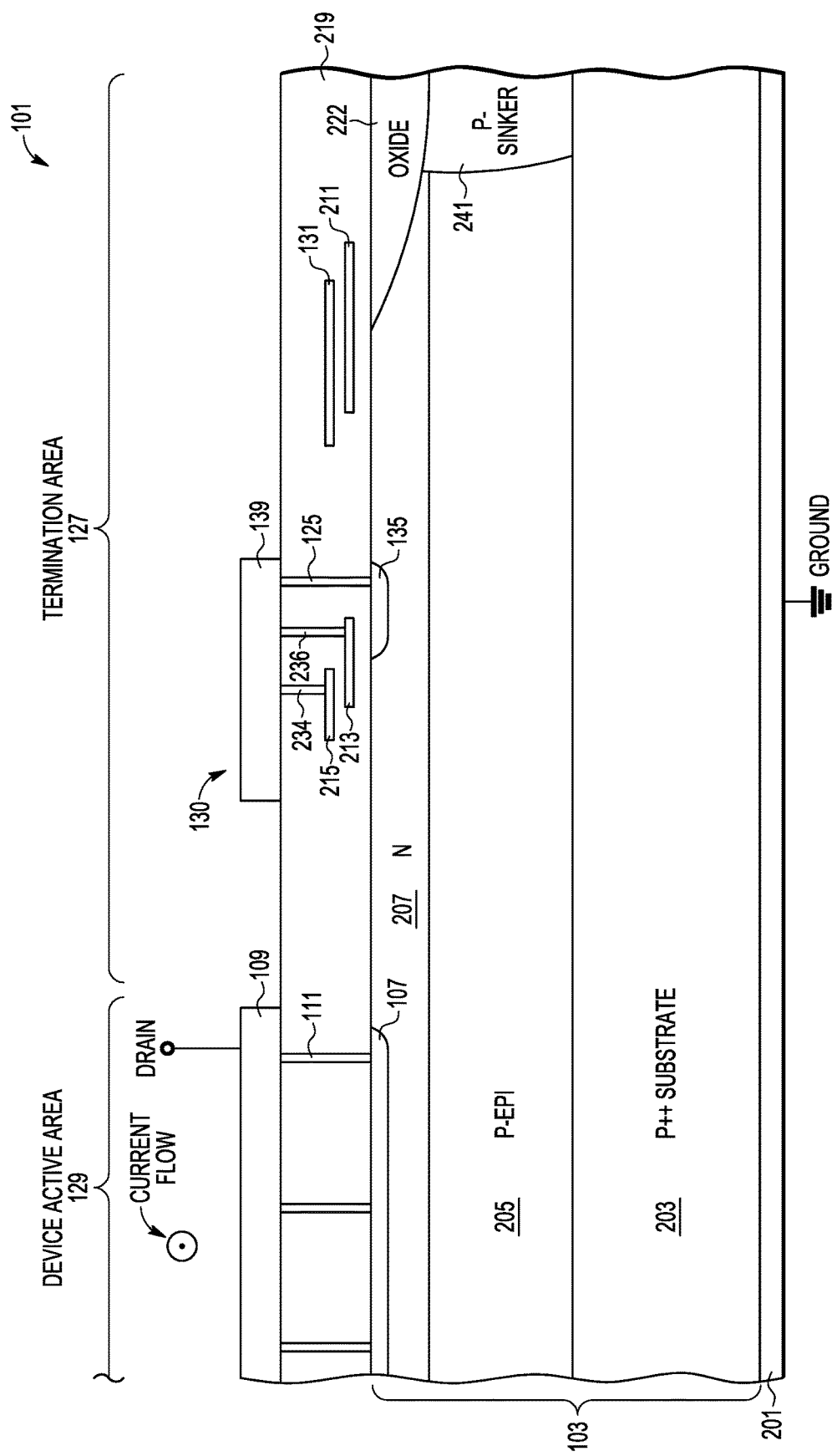
FIG. 2 is a partial cutaway side view of a semiconductor device according to one embodiment of the presentation invention.

FIG. 1 shows a partial top view of a semiconductor device according to one embodiment of the present invention. In the view of FIG. 1, portions of overlying interconnect layer and dielectric layers are not shown to illustrative features of the device. FIG. 2 is a partial cutaway side view of device 101 along the line shown in FIG. 1.

In the embodiment shown, semiconductor device 101 includes multiple LDMOS transistors located in one or more device active areas (e.g. device active area 129). Device 101 includes a drain region 107 located in semiconductor material of a semiconductor substrate 103 of device 101 below a drain plate 109 located in a metal interconnect layer. Drain plate 109 is ohmically coupled to drain region 107 by conductive vias 111, where conductive vias 111 are in ohmic contact with drain region 107. Drain region 107 is shown as a long "finger like" region running generally parallel with and between gate lines 106 and 105 which also have finger like structures. Gate lines 105 and 106 are made of a conductive material (e.g. doped polysilicon, metal) and are located over the semiconductor material of substrate 103 of device 101 at a level below the level of drain plate 109.

On opposite sides of gate lines 105 and 106 from drain region 107 are source regions 112 and 115, which are doped regions of semiconductor material in the substrate. Source region 112 is located underneath source plate 114 and source region 115 is allocated under source plate 113. Source plates 113 and 114 are made of a metal material (e.g. aluminum) and are located in the same layer (e.g. metal1) as drain plate 109. Source plates 113 and 114 are ohmically coupled to corresponding source regions by a number of conductive vias (e.g. 119). Source region 112 is located in a P-well 134 of the semiconductor substrate 103 and source region 115 is located in P-well 133 of substrate 103. In the embodiment shown, drain region 107 and source regions 112 and 115 are doped with N type conductivity dopants (phosphorous, arsenic) and P wells 133 and 134 are doped with P type conductivity dopants (e.g. Boron). In some embodiments, contact regions (not shown) of P type dopants may be located adjacent to the source regions 112 and 115 under source plates 114 and 113 and ohmically coupled to the source plates 113 and 114.

Drain region 107, gate line 106, and source region 112 act to form a first transistor with current flowing from drain region 107 through a drift region in substrate 103 (not shown), underneath gate line 106 through a channel region in P-well 134, to source region 112. A second transistors is formed from drain region 107, gate line 105, and source region 115. Current for that transistor flows from drain region 107, through a drift region in substrate 103 (not shown), under gate line 105, through a channel region in P-well 133, and into source region 115.

Device 101 includes multiple drain region fingers similar to region 107 shown in FIG. 1. Such drain region fingers may be located on opposite sides of P-well 134 and P well 133 from drain region 107 in parallel to drain region 107. The drain plates (e.g. 109) are electrically coupled together by a portion of drain plate 109 (not shown) that runs transverse to the direction of drain plate 109 shown in FIG. 1. In one embodiment, source plates 113 and 114 are coupled through one or more through hole vias (not shown) to the backside metal plate 201 (see FIG. 2). In other embodiments, the drain plates are coupled together by interconnect lines (not shown) running transverse to drain plate 109 and located at a higher interconnect level. In one embodiment, gate lines 106 and 105 are electrically coupled together at the other end (not shown but located towards the bottom of FIG. 1) of semiconductor device 101. In one embodiment, the gate lines are electrically coupled to an external terminal of a package (not shown), the drain plates (e.g. 109) are electrically coupled to a second external terminal (not shown), and the source plates 113 and 114 are electrically coupled to a third external terminal (not shown).

Semiconductor device 101 includes a guard structure 130 located in a termination area 127 of the device. The guard structure includes a floating plates 139, 215, and 213 (see FIG. 2), guard region 135, and conductive vias (e.g. 135) ohmically coupling floating plates 139, 215, and 213 to guard region 135. Guard structure 130 is located between a distal end of drain region 107 and a field plate 131. Plates 139, 215, and 213 are considered "floating" in that they are not biased to an external voltage source and that their bias condition varies with the operating conditions of the device.

Field plate 131 surrounds the area of drain region 107 and acts to terminate the efields near oxide region 222 to define a ground potential boundary. Plate 131 is located in the same metal layer as plate 215 and plate 211 is located in the same metal layer as plate 213. See FIG. 2. Plates 131 and 211 are both electrically coupled to source plates 113 and 114.

FIG. 2 shows a partial side cutaway view of device 101 along a line shown in FIG. 1. Substrate 103 includes a heavily doped P++ substrate 203 with a ground plate 201 located underneath. In one embodiment, ground plate 201 is electrically coupled to the source regions 112 and 115 through a conductive through hole via (not shown). Ground plate 201 is also coupled to an external package connector (not shown). A layer of epitaxial silicon (PEPI layer 205) is located on substrate 203. PEPI layer 205 has a net P type conductivity doping profile. N layer 207 is located on PEPI layer 205. N layer 207 has a net N type conductivity doping profile. Drain region 107 and guard region 135 are located in N layer 207. Drain region has a higher net N type conductivity doping profile than N layer 207. Guard region 135 has a heavy net P type conductivity doping profile.

Oxide region 222 is located adjacent to N layer 207 at the surface of semiconductor substrate 103 at the peripheral area of the device. A heavily P type doped sinker region 241 is located below oxide region 222 and extends to p++ substrate 203 in the embodiment shown. In one embodiment, sinker region 241 extends around the periphery of substrate 103 and, along with substrate 203, provides electrical isolation grounding for the transistors in the substrate 103. Although in some embodiments, sinker region 241 does not extend to substrate 203. Sinker region 241 has a net P type conductivity doping profile that is higher than that of PEPI layer 205.

Device 101 includes a ground field plate 131 that is located at a level below the metal layer plates 109 and 139. Plate 131 surrounds the area of drain region 107. Plate 131 is electrically coupled to source plates 113 and 114 and is electrically coupled to ground plate 201 by a through hole via (not shown). Plate 211 is located under plate 131 at a lower level. Plate 211 is located around the periphery of semiconductor device 101 and is electrically coupled to plates 113 and 114 and is electrically coupled to ground plate 201 by a through hole via (not shown). Both plates 211 and 131 provide a boundary at ground potential to terminate the efield during operation.

In the embodiment shown, guard structure 130 acts to provide termination area 127 with a relatively high current avalanche capacity. Region 135 has a relatively heavy P type net conductivity doping profile. The heavy doping of region 135 provides abundant charges in the region to prevent region 135 from being fully depleted during operation. Consequently, guard region 135 stays at a relatively constant bias, floating with a drain bias swing during device operation.

Guard structure 130 includes floating plates 215 and 213. Floating plates 215 and 213 are ohmically coupled to guard region 135 through vias 234 and 236 to field plate 139. Field plate 139 is ohmically coupled to guard region 135 by conductive vias 125 being in ohmic contact with region 135. Portions of plate 139 vertically overlap plates 213 and 215.

In one embodiment, floating plates 139, 215, and 213 extend out past the edge of guard region 135 over N layer 207 towards the area of the drain region 107. During operation, the floating plates 139, 215, and 213 have a relatively negative surface potential with respect to the N layer 207 below. This acts to push electrons away from the surface of layer 207 thus expanding the depletion layer in layer 207 to reduce the efield. Floating plates 139, 215, and 213 are stepped in that plate 139 extends closer to the area of drain region 107 than plate 215 and plate 215 extends closer to the drain region than plate 213. This step configuration of the plates acts to smooth out the electrical field distribution in the direction towards the area of drain region 107. The smoothing out of the electrical field reduces hot spots in the termination area. Because floating plates 213, 215, and 139 are ohmically coupled to guard region 135, they have the same bias as guard region during operation. Therefore, the potential of plates 213, 215, and 139 is defined by guard region 135 and is not impacted by surface charge accumulation or redistribution. This may be advantageous during reliability testing since external surface charges are not able to alter the bias condition of these plates.

As compared with devices that have no guard structures in the termination areas, some embodiments of guard structures disclosed herein allow for a more gradual reduction of the voltage potential from the drain region to guard region in the termination area. This acts to eliminate hot spots in the termination area. In contrast, termination areas without a guard structure have a more uniform voltage potential across the termination area to ground structures at the peripheral area where the abrupt change in voltage potential occurs at the peripheral area. This abrupt change in potential creates a hot spot in the termination area.

In some embodiments, the distance from the left edge (relative to the view shown in FIG. 2) of plate 139 to the right edge of plate 109 is dependent on the voltage rating of the device. In some devices with a BVDSS of 250V, the edges are separated by a distance in the range of 15-20 µm. In some devices with a BVDSS of 300V, the edges are separated by a distance in the range of 20-30 µm. However, the distance between the plate edges maybe of other values in other embodiments.

In some embodiments, the right edge of plate 139 is located at a lateral distance in the range of 6-10 µm away from the area of the left edge of plate 131, but may be located at other distances in other embodiments. In one embodiment, guard region 135 is located at a distance in the range of 15-20 µm away from drain region 107 and located at a distance in the range 8-12 µm away from oxide region 222, but maybe located at other distances in other embodiments. Adjusting the distance between the drain region and the oxide region can be used to adjust the BVDSS of a device, with greater distances providing for higher BVDSS.

In the embodiment shown, plate 139 has a width in the range of 6-10 µm (left and right relative to the view of FIG. 2), plate 215 has a width in the range of 2-4 µm, plate 213 has a width in the range of 2-4 µm, and region 135 has a width in the range of 2-3 µm. However, these widths may be of other values in other embodiments. In some embodiments, it may desirable for these widths to be increased for higher voltage devices.

Referring back to FIG. 1, the width (relative to the view shown in FIG. 1) of plate 139 is approximately equal to that of the width of drain plate 109. Also in some embodiments, the width of plates 213 and 215 are the same as the width of plate 139.

Figure 3:
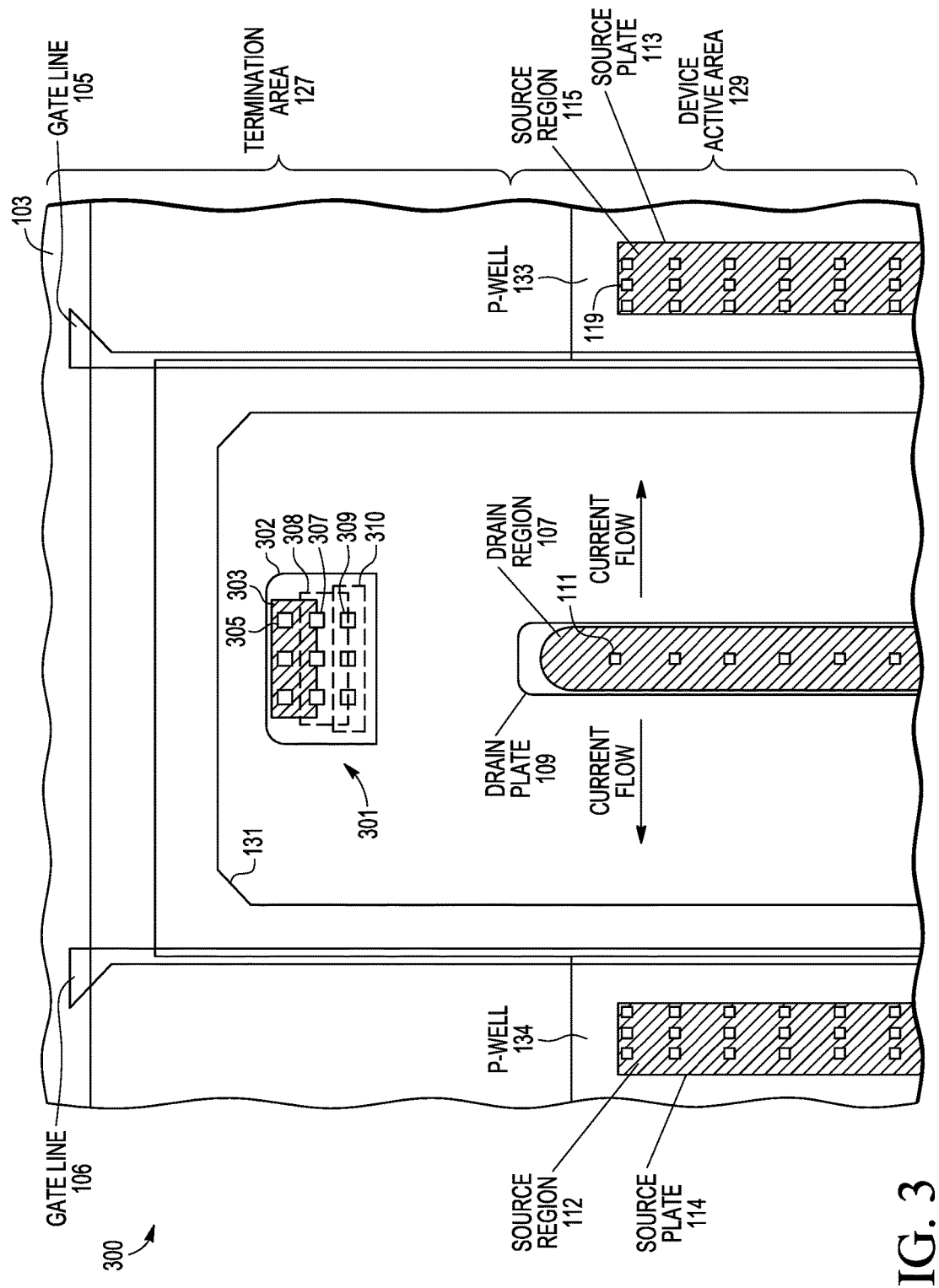
FIG. 3 is a partial top view of a portion of a semiconductor device according to another embodiment of the presentation invention.

FIG. 3 is a top view of a semiconductor device according to another embodiment of the present invention. Device 300 is similar to device 101 of FIGS. 1 and 2 with similar structures having the same reference numbers as the corresponding structures of FIGS. 1 and 2. The major different between semiconductor device 300 and semiconductor device 101 is that guard structure 301 of device 300 is wider (relative to the view shown in FIG. 3) than that of drain region 107 and drain plate 109. Guard structure 301 includes a floating field plate 302, floating field plate 308 (shown in dashed lines), floating field plate 310 (shown in dashed lines), a guard region 303 (shaded and located in the semiconductor substrate underneath floating field plate 302), and conductive vias (e.g. 305) for ohmically coupling plate 302 to region 303. Plates 310 and 308 are vertically located between plate 302 and the semiconductor substrate. In one embodiment, plates 310 and 308 are located at the same layer as floating field plates 215 and 213, respectively, of FIG. 2. Conductive vias 307 electrically coupled plate 302 to plate 308 and conductive vias 309 electrically coupled plate 302 to plate 310.

Like guard structure 130 of FIG. 2, the floating field plates of guard structure 301 (plates 302, 310, and 308) have a step profile in the direction of drain region 107 with plate 302 extending laterally the closest to drain region 107 and plate 310 extending the next closest. This step profile aids in smoothing out the electrical field distribution profile.

In addition, plates 302, 310, and 308 also have a step profile in a direction that is transverse (to the left and right in the view of FIG. 3) to the direction that the drain region runs (up and down relative to the view of FIG. 3). With this step profile, plate 302 is the widest plate in the transverse direction followed by plate 310 and then plate 308. However, in other embodiments, plates 308 and 310 have the same width and are coextensive in the transverse direction with plate 302.

In one embodiment, drain region 107 has a width in the transverse direction in the range of 3-5 µm, plate 302 has a width in the range of 9-12 µm for a BVDSS of 250V and a width in the range of 12-18 µm for a BVDSS of 300V, plate 308 has a width in the range of 9-12 µm for a BVDSS of 250V and a width in the range of 12-18 µm for a BVDSS of 300V, and guard region 303 has a width in the range of 7-10 µm for a BVDSS of 250V and a width in the range of 10-16 µm for a BVDSS of 300V. However, these dimensions maybe be of other values in other embodiments.

Providing a guard structure with field plates that are wider than the drain region in a direction that is transverse to length of the drain region (107) finger provides for a guard structure that smooths the electrical field in the diagonal direction from the distal end of the drain region 107 as well as in the direction of the drain region finger (up and down relative to the view of FIG. 3). In this way, it provides for smoothing of the electrical field in other parts of the termination area. This may be especially advantages for high voltage devices.

Figure 4:
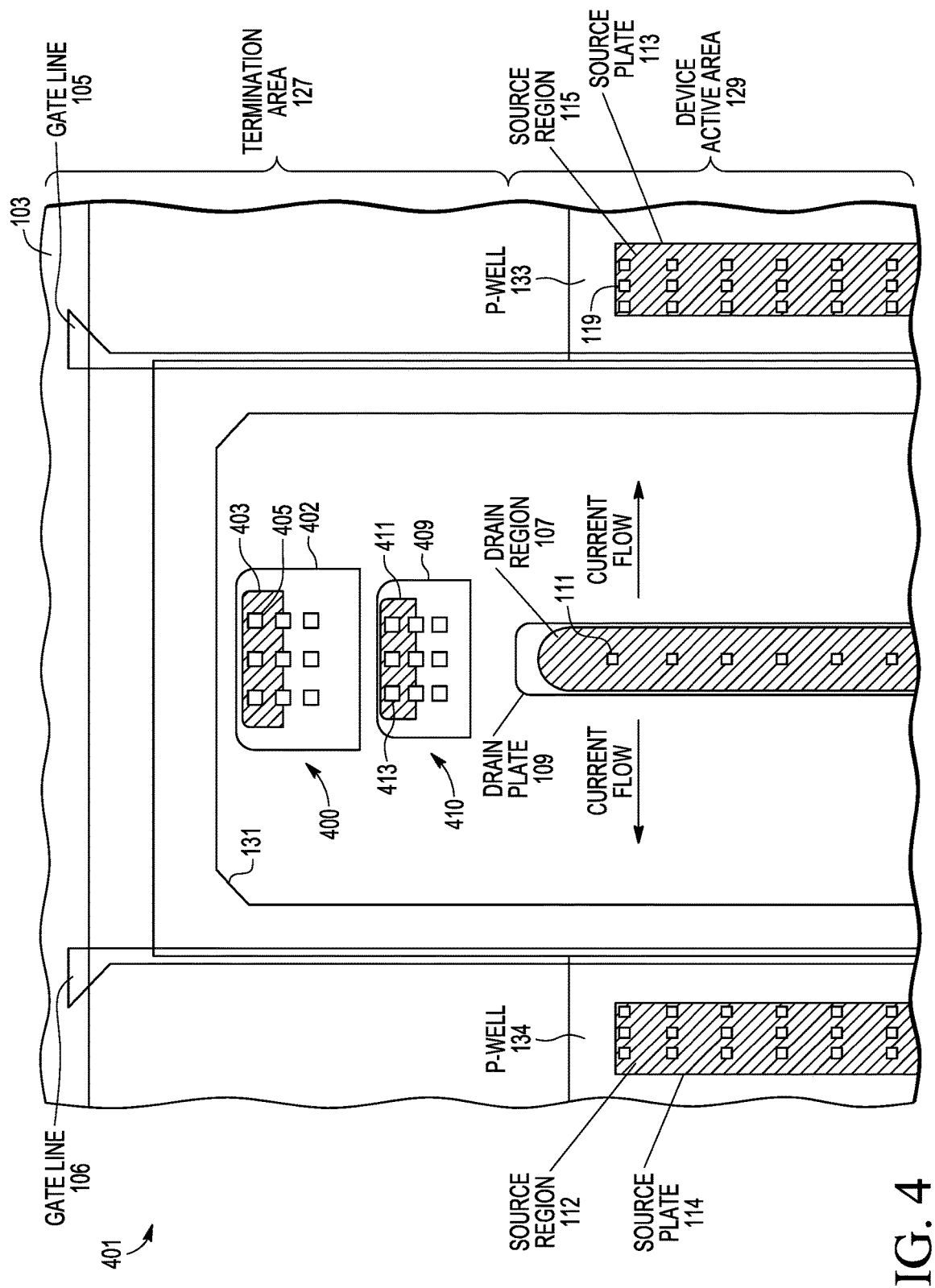
FIG. 4 is a partial top view of a portion of a semiconductor device according to another embodiment of the presentation invention.

FIG. 4 shows a semiconductor device 401 which is similar to device 101 except that it includes two guard structures 400 and 410 in the termination area between the area of drain region 107 and a peripheral area portion of plate 131 in a direction that runs with the finger-like drain region 107 (up and down relative to the view of FIG. 4). In the embodiment shown, guard structure 400 includes a guard region 403 located in a semiconductor substrate, floating plate 402, and conductive vias 405 for ohmically coupling guard region 403 to floating plate 402. Guard structure 400 also includes two intermediate floating plates (not shown) that are similar to plates 215 and 213 of FIG. 1. Guard structure 410 includes a guard region 411 located in a semiconductor substrate, floating plate 409, and conductive vias 413 for ohmically coupling guard region 411 to floating plate 409. Guard structure 400 also includes two intermediate floating plates (not shown) that are similar to plates 215 and 213 of FIG. 1. In one embodiment, the intermediate floating plates (not shown) of guard structures 400 and 410 are stepped in the direction of the area of drain region 107 (towards the bottom relative to the view shown in FIG. 4). In one embodiment, the intermediate floating plates (not shown) are coextensive in the transverse direction (left and right relative to the view shown in FIG. 4) with the top floating plates (410 and 409) of their guard structure. However, in other embodiments, the plates would have a stepped profile in the transverse direction (similar to guard structure 301 of FIG. 3).

In the embodiment shown, plate 409 is wider than drain plate 109 and plate 402 is wider than plate 409. Also guard region 411 is wider than drain region 107 and guard region 403 is wider than guard region 411. In the embodiment shown, plate 402 is longer (in the up and down direction of FIG. 4) than plate 409. In one embodiment, plate 402 has a width of in the range of 18-24 µm and a length in the range of 8-10 µm (relative to the view of FIG. 4), plate 409 has a width of in the range of 12-18 µm and a length in the range of 6-8 µm, guard region 403 has a width in the range of 14-20 µm and a length in the range of 2-4 µm, guard region 411 has width in the range of 7-9 µm and a length in the range of 2-4 µm, and drain region has a width in the range of 3-5 µm. In one embodiment, plate 402 is located at a distance in the range of 20-25 µm from plate 409 and plate 409 is located at a distance in the range of 20-25 µm from plate 109 in the up and down direction of FIG. 4. Plate 402 is located at a distance in the range of 8-10 µm from plate 131 in the up and down direction of FIG. 4. However, these dimensions maybe of other values in other embodiments.

Utilizing two guard structures may provide a termination area with higher avalanche capability at the higher voltage ranges (e.g. 300 volts and greater). Because the guard structures are wider than the drain region, the guard structures help smooth the electric fields in both the direction running with the finger-like drain region (up and down relative to the view shown in FIG. 4) and in a direction that is diagonal to that direction from the distal end of the drain region. Furthermore, providing two guard structures provides for a smoother voltage transition from the high voltage applied to the drain terminal to the ground voltage at the edge of device 401 at ground plate 131, as opposed to a more abrupt transition with one guard structure. With two guard structures, guard structure 410 would be at a higher potential than guard structure 400 during operation. Furthermore, having more than one guard structure with floating plates may provide for more metal coverage over the termination area which may reduce the influence of external surface charges on the device during reliability testing. Other embodiments may utilize a greater number of guard structures.

Although the guard structures shown in FIGS. 1-4 have a rectangular shape, a guard structure may have other shapes in other embodiments. For example, in some embodiments, a guard structure may have a "horse shoe" shape where the open end of the horse shoe structure opens towards the distal end of the drain region 107. This structure may act to smooth the electrical field distribution in a wider array of directions of the termination area from the distal end of the drain region.

FIGS. 5-10 set forth partial cutaway side views of various stages in the manufacture of a guard structure in a semiconductor device according to one embodiment of the present invention. The views of FIGS. 5-10 are of a similar view to the view of FIG. 2.

Figure 5:
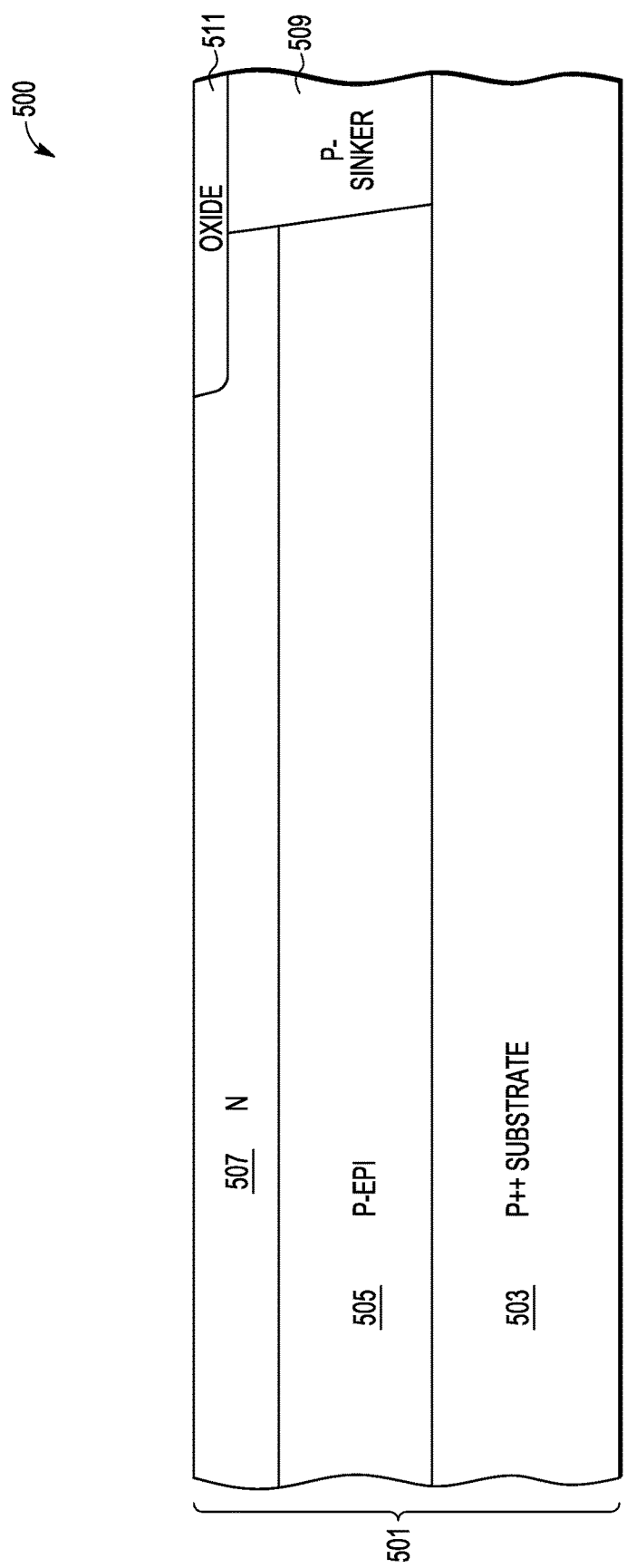
FIGS. 5-10 are partial cutaway side views of various stages in the manufacture of a semiconductor device according to one embodiment of the present invention.

FIG. 5 shows a semiconductor substrate 501 portion of a wafer at one stage of manufacture of a semiconductor device. Substrate 501 initially begins as a heavily doped P type conductivity silicon substrate layer 503. The P type conductivity dopant boron is either formed in-situ with the silicon substrate or is implanted after substrate formation. In one embodiment, substrate layer 503 has a boron dopant concentration of 6e18 cm$^{-3}$, but may be of other concentrations in other embodiments. In one embodiment, substrate layer 503 is mono crystalline silicon, but may be of other types of semiconductor material such as silicon germanium, silicon carbide, gallium arsenide, gallium nitride, another III-V semiconductor material, or an II-IV semiconductor material.

A semiconductor layer 505 is epitaxial grown on substrate layer 503. In one embodiment, layer 505 is grown by an epitaxial process and in-situ doped with a P type conductivity dopant (boron) at a concentration in the range of 9e14 cm$^{-3}$ to 2e15 cm$^{-3}$, but may be of other concentrations in other embodiments. In one embodiment, layer 505 is grown to a thickness in the range of 19 µm to 40 µm, but may be grown to other thicknesses in other embodiments.

After the formation of layer 505, a P-sinker region 509 is formed around the perimeter of the semiconductor device by and the implantation of P type conductivity dopants. In one embodiment, boron is implanted to form sinker region 509 at a dosage of 1.2e12 cm$^{-2}$ and at an energy of 60 KeV, however, a sinker region may be formed by the implantation at other dosages and other energies in other embodiments. In some embodiments, the final depth of P-sinker region 509 after the anneal of the P-sinker dopants will be in the range of 5 µm-9 µm. Since PEPI layer 205 may have a thickness in the range of 19 µm-40 µm, P-sinker region 241 may not extend to substrate 203 in some of these embodiments.

After the formation of sinker region 509, N type dopants are implanted into areas of layer 505 to form an N type layer 507 at the surface of layer 505 in selected locations. In one embodiment, layer 507 is formed by the implantation of N type conductivity dopants (phosphorous, arsenic). In one embodiment, the implantation process is a chain implantation process with a total dosage in the range of 2e12 cm$^{-2}$ to 3e12 cm$^{-2}$ and at energies in the range of 50 KeV to 1.9 MeV, depending on the voltage rating of the device, but may be implanted by other implantation processes at other dosages and at other energies in other embodiments. In one embodiment, layer 507 has a depth in the range of 2.5 µm to 5 µm, depending on device voltage rating, but may be of other depths in other embodiments. In some embodiments, the N type dopants are not implanted into the channel regions of the surface of layer 505. In other embodiments, the P-well for the channel region may be formed by other implantation steps. After the formation of N layer 507, an isolator structure (oxide 511) is formed in the surface of layer 507. In one embodiment, oxide 511 is formed by a selective oxidation process (e.g. a LOCOS process). In other embodiments, oxide 511 may be formed by a trench isolation process.

Figure 6:
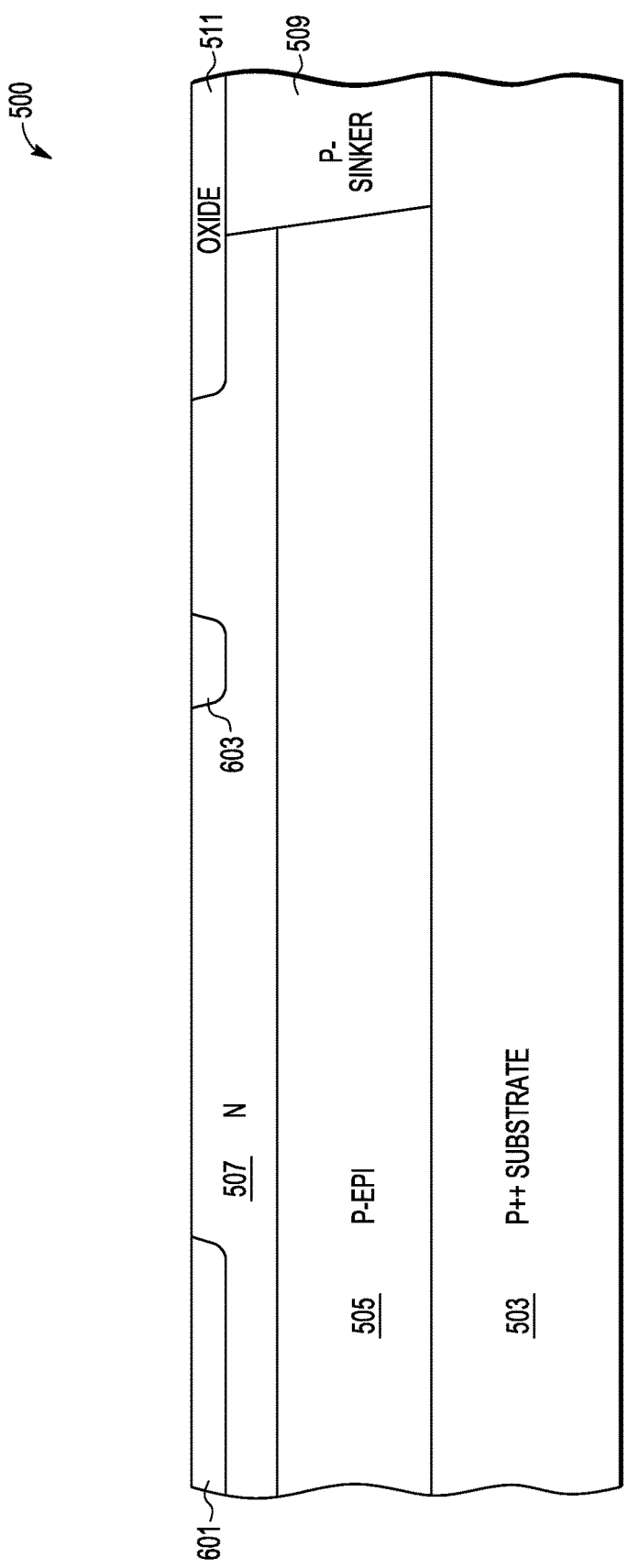

FIG. 6 shows substrate 501 after the selective implantation of N type dopants to form drain region 601 and the selective implantation of P type dopants to form guard region 603. In one embodiment to form drain region 601, N type dopants are implanted in layer 507 at an energy of 70 KeV and a dosage of 4e15 cm$^{-2}$, but may be implanted at other energies and other dosages in other embodiments. In some embodiments, region 601 is formed simultaneously with the implantation of source regions (not shown) on the wafer.

In one embodiment to form guard region 603, P type dopants are implanted in layer 507 at an energy of 40 KeV and a dosage of 5.8e13 cm^−2, but may be implanted at other energies and other dosages in other embodiments. In one embodiment, guard region is formed simultaneously with a contact regions (not shown) adjacent to the source regions (not shown). The implantations are made by forming a patterned mask on substrate 501 where openings in the mask are located at the desired areas for implantation.

Figure 7:
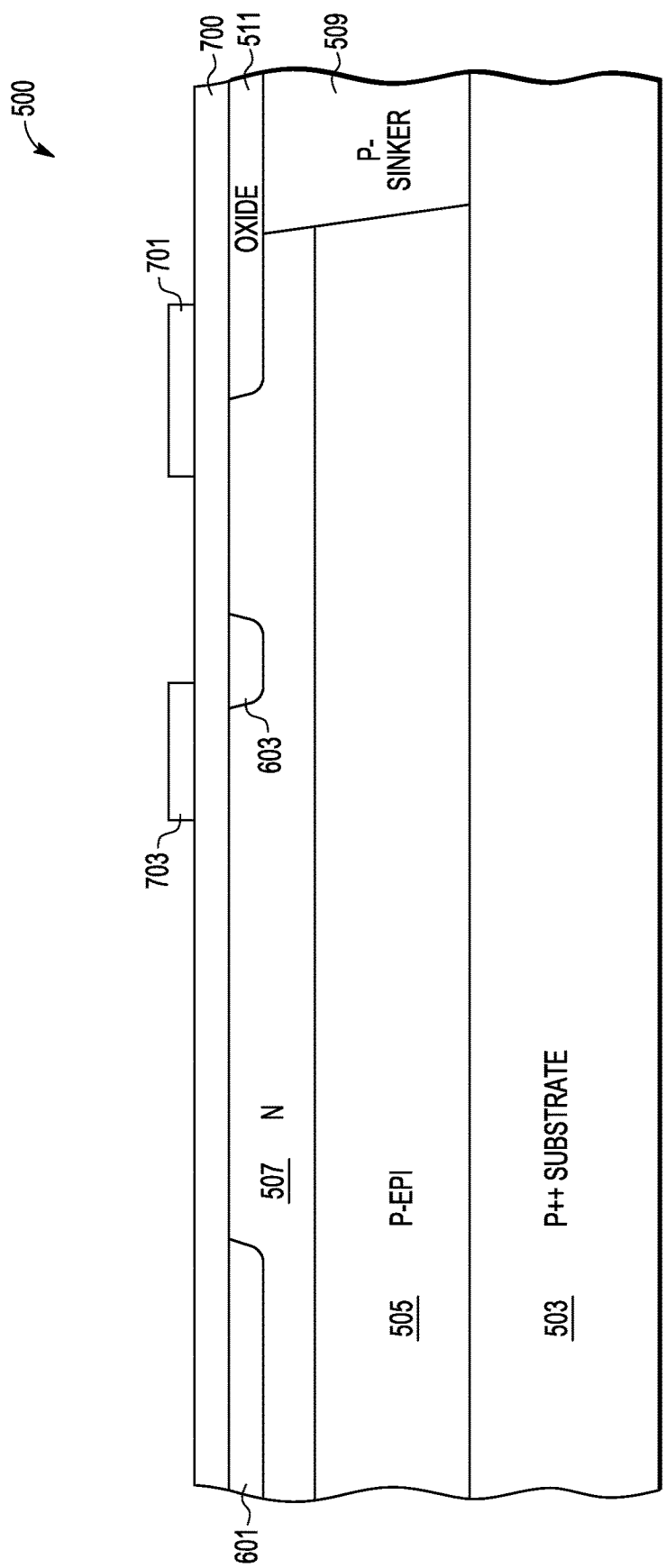

FIG. 7 shows wafer 500 after dielectric layer 700 is formed over substrate 501 followed by the formation of floating plate 703 and ground plate 701. In one embodiment, dielectric layer 700 is of an interlayer dielectric material (e.g. an oxide layer formed by a TEOS process). In other embodiments, layer 700 may be made of multiple layers of dielectric materials. Plates 703 and 701 are made from a layer of metal (e.g. tungsten) that is formed on layer 700 and selectively etched. Layer 700 may be planarized prior to forming the metal layer. In one embodiment, layer 700 has a thickness of 1500 Å and the metal layer has a thickness of 900 Å, but these layers may be of other thicknesses in other embodiments.

Figure 8:
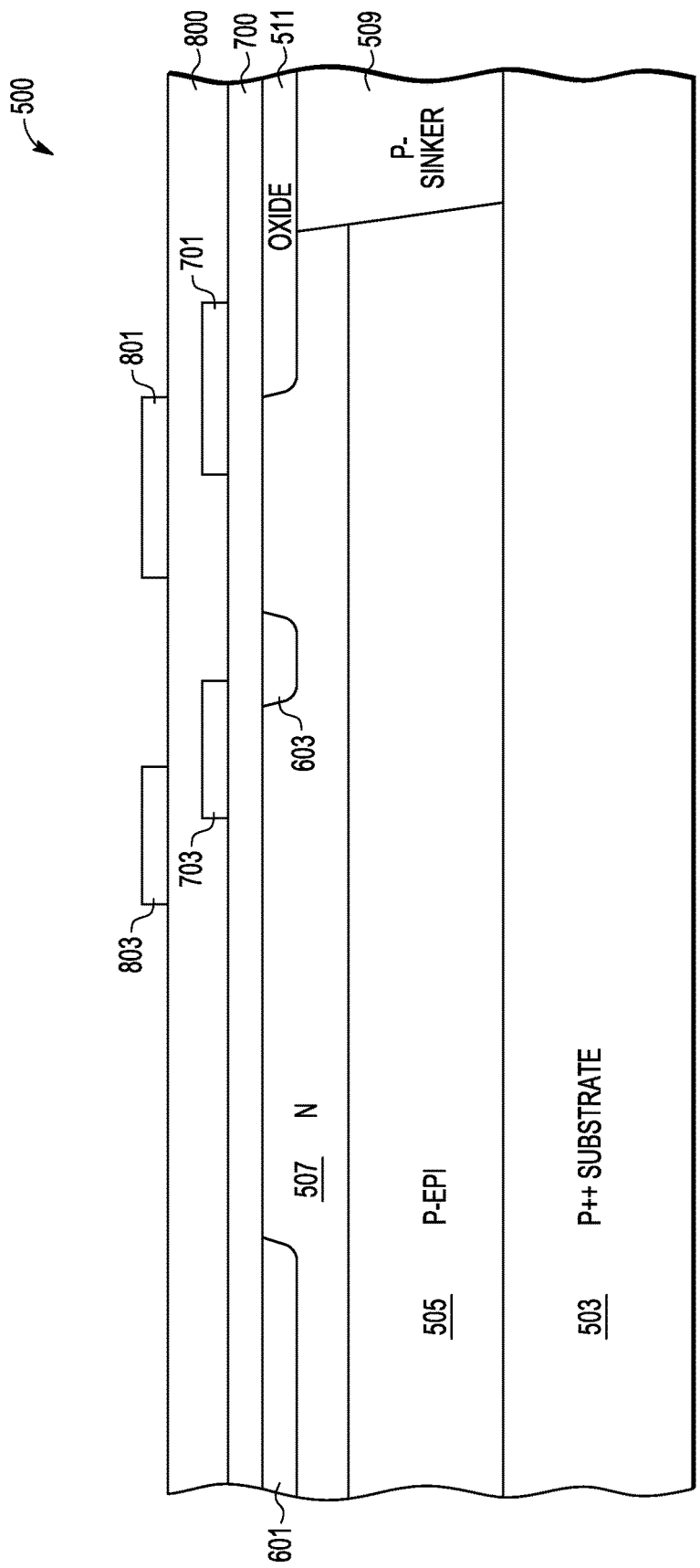

FIG. 8 shows wafer 500 after dielectric layer 800 is formed over layer 700 followed by the formation of floating plate 803 and shield plate 801. In one embodiment, dielectric layer 800 is made of an interlayer dielectric material (e.g. an oxide layer formed by a TEOS process). In other embodiments, layer 800 may be made of multiple layers of dielectric materials. Plates 803 and 801 are made from a layer of metal (e.g. tungsten) that is formed on layer 800 and selectively etched. Layer 800 may be planarized prior to forming the metal layer of plates 803 and 801. In one embodiment, layer 800 has a thickness of 1500 Å and the metal layer has a thickness of 900 Å, but these layers may be of other thicknesses in other embodiments.

Figure 9:
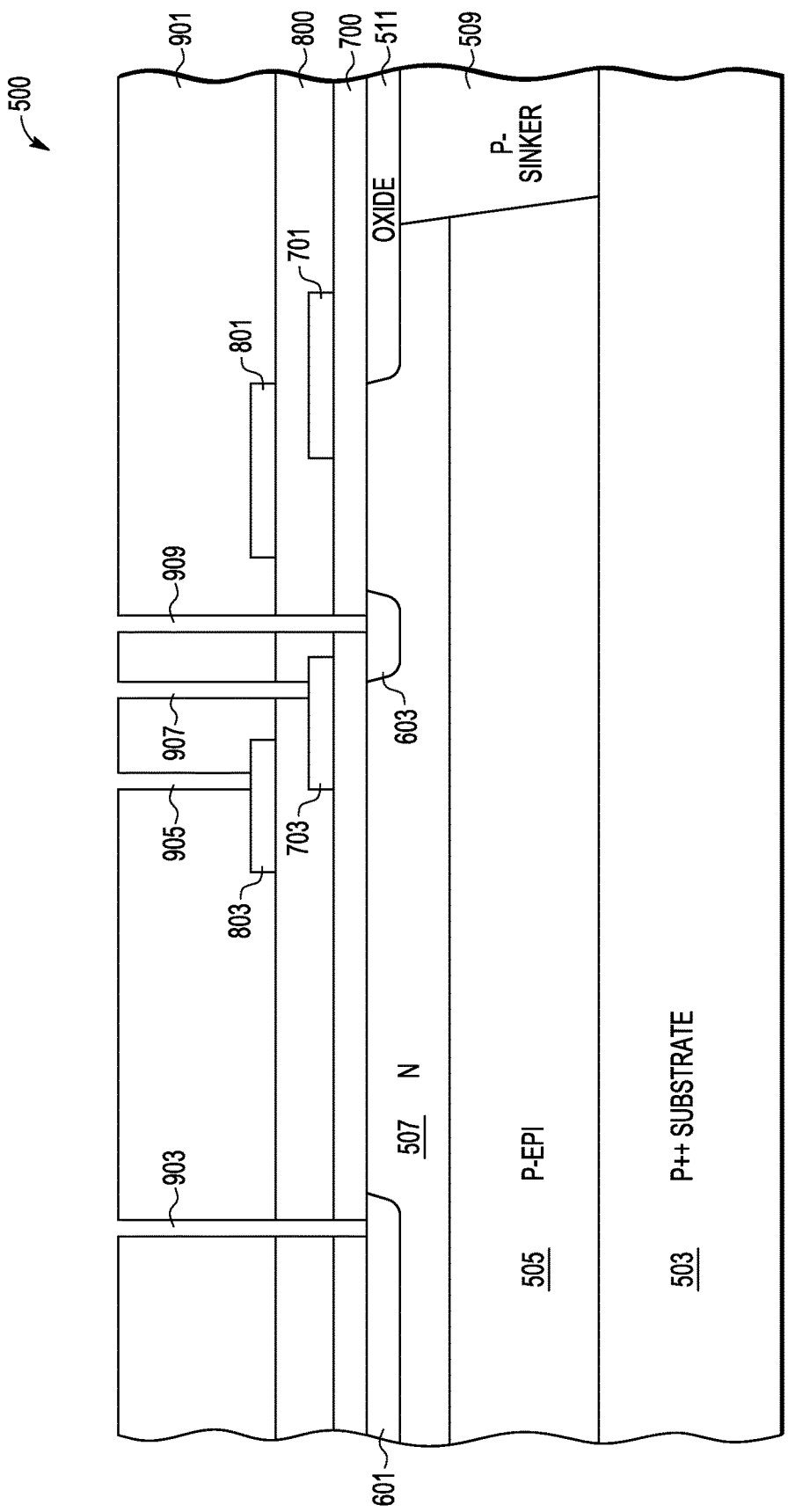

FIG. 9 shows substrate 501 after the formation of dielectric layer 901. In one embodiment, layer 901 is made of an interlayer dielectric material such as oxide formed by a TEOS process, undoped silicon glass, or a different type of oxide. In one embodiment, layer 901 has a thickness of 2700 Å but may be of other thicknesses in other embodiments.

After the formation of layer 901, via openings are formed in layer 901 to expose the conductive structures of device 101. Via 903 is formed to expose drain region 601, via 905 is formed to expose floating plate 803, via 907 is formed to expose floating plate 703, and via 909 is formed to expose guard region 603. In one embodiment, these vias are formed by forming a patterned masking layer (e.g. silicon nitride) on layer 901 with openings at the desired via locations followed by exposing the openings to an etchant that is selective to the material of layers 901, 800, and 700 and is selective with respect to the material of the masking structure, plates 801, 803, 701, and 703, and the silicon of layer 507.

Figure 10:
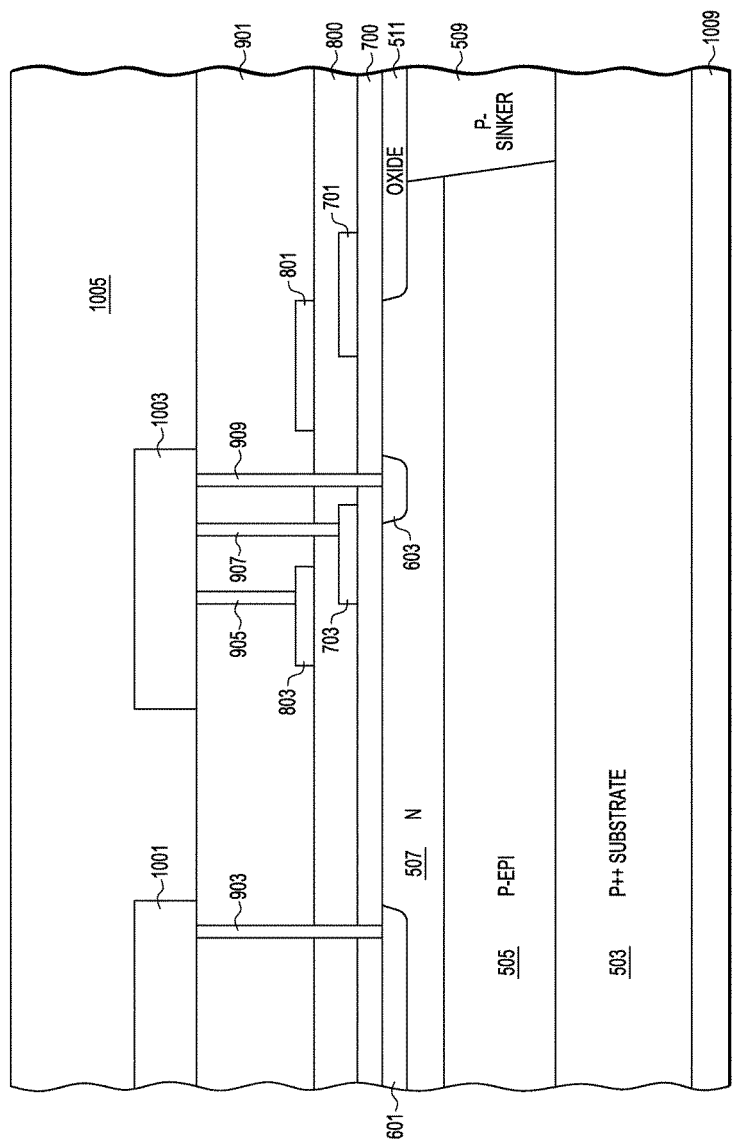

FIG. 10 shows substrate 501 after the formation of conductive material in vias 903, 905, 907, and 909 and the formation of drain field plate 1001 and floating field plate 1003. In one embodiment, the conductive material in the vias are formed by depositing a layer of metal (e.g. tungsten) that fills the vias and extends above layer 901. The wafer is then planarized to remove the metal outside of the vias. Next, a metal layer (e.g. aluminum) is deposited on the planarized surface to contact the tungsten in the vias. Afterwards, the metal layer is selectively etched to formed plates 1001 and 1003. In some embodiments, a barrier layer (e.g. titanium, titanium nitride) may be formed in the vias to contact drain region 601, guard region 603, and the floating plates, followed by the formation of the conductive via material. The conductive material in vias 903 and 909 make ohmic contact with drain region 601 and guard region 603, respectively. In one embodiment, plates 1001 and 1003 have a thickness 1.6 μm, but may have other thicknesses in other embodiments.

After the formation of plates 1001 and 1003, other layers may be formed over substrate 501 including dielectric layer 1005. Other interconnect layers maybe formed over layer 1005 to connect the drain plates and gates to external device terminals (e.g. bond pads not shown). A ground plate 1009 is formed on the backside of substrate 501. In some embodiments, the wafer is ground to reduce the thickness of layer 503 before forming the ground plate. Afterwards, the wafer is diced to separate the semiconductor devices into individual die. The die are packaged (e.g. in leaded packages) to be implemented in a system, e.g. such as mounting on a circuit board. Examples of systems in which the devices maybe implemented include cell phones, base stations, other wireless transmitters, motorized vehicles, and heating appliances such as microwave ovens.

In other embodiments, the net conductivity doping profiles of the semiconductor device may be switched. For example, the drain and source regions may have a P type net conductivity doping profile and the guard region may have an N type net conductivity doping profile. Also, the guard structures may have a different number of plates located above the semiconductor substrate. Furthermore, guard structures described herein may be utilized in the termination areas of other types of transistors or other types of semiconductor devices e.g. diodes, IGBTs, thyristors, or power MOSFETs.

In one embodiment, a semiconductor device includes a substrate including a device active area and a termination area. The device includes a current terminal region. The current terminal region is located in the device active area of the substrate and has a net conductivity doping profile of a first type and of a first concentration. The device includes an insulator structure located at least partially in the termination area of the substrate. At least a portion of the insulator structure is located in the substrate. The termination area includes semiconductor material having a net conductivity doping profile of the first type and at a second concentration that is less than the first concentration. The device includes a guard structure. The guard structure includes a guard region located in the termination area of the substrate between the current terminal region and the insulator structure. The guard region has a net conductivity doping profile of a second type opposite the first type. The semiconductor material having a net conductivity doping profile of the first type is located between the guard region and the insulator structure and between the guard region and the current terminal region. The guard structure includes a first floating field plate located over the termination area of the substrate at a first level. The first floating field plate is ohmically coupled to the guard region. The guard structure includes a second floating field plate located over the termination area of the substrate at a second level above the first level. The second floating field plate being ohmically coupled to the guard region. At least a portion of the second floating field plate vertically overlaps at least a portion of the first floating field plate.

In another embodiment, a semiconductor device includes a substrate including a device active area and a termination area. The substrate includes a current terminal region located in the device active area of the substrate and having a net conductivity doping profile of a first type and of a first concentration. The device includes a guard structure in the termination area. The guard structure includes a guard region located in the termination area of the substrate between the current terminal region and an area of a periphery of the termination area. The guard region has a net conductivity doping profile of a second type opposite the first type. Semiconductor material has a net conductivity doping profile of the first type is located between the guard region and the area of the periphery of the termination area and between the guard region and the current terminal region. The guard region includes a first floating field plate located over the termination area of the substrate at a first level. The first floating field plate being ohmically coupled to the guard region. The guard region includes a second floating field plate located over the termination area of the substrate at a second level above the first level. The second floating field plate is ohmically coupled to the guard region. At least a portion of the second floating field plate vertically overlaps at least a portion of the first floating field plate.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A semiconductor device comprising:
    a substrate including a device active area and a termination area;
    a current terminal region, the current terminal region located in the device active area of the substrate and having a net conductivity doping profile of a first type and of a first concentration;
    an insulator structure located at least partially in the termination area of the substrate, at least a portion of the insulator structure located in the substrate;
    wherein the termination area includes semiconductor material having a net conductivity doping profile of the first type and at a second concentration that is less than the first concentration;
    a guard structure, the guard structure including:
        a guard region located in the termination area of the substrate between the current terminal region and the insulator structure, wherein the guard region has a net conductivity doping profile of a second type opposite the first type, wherein the semiconductor material having a net conductivity doping profile of the first type is located between the guard region and the insulator structure and between the guard region and the current terminal region;
        a first floating field plate located over the termination area of the substrate at a first level, the first floating field plate being ohmically coupled to the guard region;
        a second floating field plate located over the termination area of the substrate at a second level above the first level, the second floating field plate being ohmically coupled to the guard region, at least a portion of the second floating field plate vertically overlaps at least a portion of the first floating field plate;
    where in the semiconductor device includes a laterally diffused MOSFET and the current terminal region is characterized as a drain region.

2. The semiconductor device of claim 1, wherein the substrate includes a first layer of semiconductor material having net conductivity doping profile of the second type located in the termination area, the semiconductor material having a net conductivity doping profile of the first type is located over the first layer.

3. The semiconductor device of claim 2 wherein the first layer is characterized as epitaxial grown semiconductor material.

4. The semiconductor device of claim 2 wherein the guard region is located in the semiconductor material having a net conductivity doping profile of the first type, the guard region is separated vertically from the first layer by the semiconductor material having a net conductivity doping profile of the first type.

5. The semiconductor device of claim 2 wherein the first layer extends below the current terminal region.

6. The semiconductor device of claim 1 further comprising:
    a current terminal electrode, the current terminal electrode electrically coupled to the current terminal region, the current terminal electrode located at a first metal level above the substrate, wherein the second floating field plate is located at the first metal level.

7. The semiconductor device of claim 1 further comprising:
    a current terminal electrode, the current terminal electrode electrically coupled to the current terminal region, the current terminal electrode located at a first metal level above the substrate, wherein the first floating field plate and the second floating field plate are each located at a level below the first metal level.

8. The semiconductor device of claim 1 wherein the guard region is located between the insulator structure and the current terminal region in a first direction, the current terminal region has a width in a second direction that is transverse to the first direction, wherein the guard region has a greater width in the second direction than a width of the current terminal region.

9. The semiconductor device of claim 1 wherein the second floating field plate extends over the substrate closer to an area of the current terminal region than the first floating field plate.

10. The semiconductor device of claim 1 wherein the second floating field plate includes a portion located directly over the semiconductor material having a net conductivity doping profile of the first type located between the guard region and the current terminal region.

11. The semiconductor device of claim 10 wherein the first floating field plate includes a portion located directly over the semiconductor material having a net conductivity doping profile of the first type located between the guard region and the current terminal region.

12. A semiconductor device comprising:
    a substrate including a device active area and a termination area;
    a current terminal region, the current terminal region located in the device active area of the substrate and having a net conductivity doping profile of a first type and of a first concentration;
    an insulator structure located at least partially in the termination area of the substrate, at least a portion of the insulator structure located in the substrate;
    wherein the termination area includes semiconductor material having a net conductivity doping profile of the first type and at a second concentration that is less than the first concentration;
    a guard structure, the guard structure including:
        a guard region located in the termination area of the substrate between the current terminal region and the insulator structure, wherein the guard region has a net conductivity doping profile of a second type opposite the first type, wherein the semiconductor material having a net conductivity doping profile of the first type is located between the guard region and the insulator structure and between the guard region and the current terminal region;
a first floating field plate located over the termination area of the substrate at a first level, the first floating field plate being ohmically coupled to the guard region;
a second floating field plate located over the termination area of the substrate at a second level above the first level, the second floating field plate being ohmically coupled to the guard region, at least a portion of the second floating field plate vertically overlaps at least a portion of the first floating field plate;
a third field plate located at least over the insulator structure, the third field plate electrically coupled to a ground terminal, the third field plate being at a same level as one of the first floating field plate or the second floating field plate.

13. A semiconductor device comprising:
a substrate including a device active area and a termination area;
a current terminal region, the current terminal region located in the device active area of the substrate and having a net conductivity doping profile of a first type and of a first concentration;
an insulator structure located at least partially in the termination area of the substrate, at least a portion of the insulator structure located in the substrate;
wherein the termination area includes semiconductor material having a net conductivity doping profile of the first type and at a second concentration that is less than the first concentration;
a guard structure, the guard structure including:
  a guard region located in the termination area of the substrate between the current terminal region and the insulator structure, wherein the guard region has a net conductivity doping profile of a second type opposite the first type, wherein the semiconductor material having a net conductivity doping profile of the first type is located between the guard region and the insulator structure and between the guard region and the current terminal region;
  a first floating field plate located over the termination area of the substrate at a first level, the first floating field plate being ohmically coupled to the guard region;
  a second floating field plate located over the termination area of the substrate at a second level above the first level, the second floating field plate being ohmically coupled to the guard region, at least a portion of the second floating field plate vertically overlaps at least a portion of the first floating field plate;
a second guard structure, the second guard structure including:
  a second guard region located in the termination area between the guard region and the insulator structure, wherein the second guard region has a net conductivity doping profile of the second type, wherein the semiconductor material having a net conductivity doping profile of the first type is located between the second guard region and the insulator structure and between the guard region and the second guard region;
  a third floating field plate located above the termination area of the substrate at the first level, the third floating field plate being ohmically coupled to the second guard region;
  a fourth floating field plate located over the termination area of the substrate at the second level above the first level, the fourth floating field plate being ohmically coupled to the second guard region, at least a portion of the fourth floating field plate overlaps the third floating field plate.

14. The semiconductor device of claim 13 wherein the guard region and the second guard region are located between the insulator structure and the current terminal region in a first direction, a second direction is transverse to the first direction, wherein the second guard region has a greater width in the second direction than the guard region.

15. A semiconductor device comprising:
a substrate including a device active area and a termination area;
a current terminal region, the current terminal region located in the device active area of the substrate and having a net conductivity doping profile of a first type and of a first concentration;
an insulator structure located at least partially in the termination area of the substrate, at least a portion of the insulator structure located in the substrate;
wherein the termination area includes semiconductor material having a net conductivity doping profile of the first type and at a second concentration that is less than the first concentration;
a guard structure, the guard structure including:
  a guard region located in the termination area of the substrate between the current terminal region and the insulator structure, wherein the guard region has a net conductivity doping profile of a second type opposite the first type, wherein the semiconductor material having a net conductivity doping profile of the first type is located between the guard region and the insulator structure and between the guard region and the current terminal region;
  a first floating field plate located over the termination area of the substrate at a first level, the first floating field plate being ohmically coupled to the guard region;
  a second floating field plate located over the termination area of the substrate at a second level above the first level, the second floating field plate being ohmically coupled to the guard region, at least a portion of the second floating field plate vertically overlaps at least a portion of the first floating field plate;
wherein the current terminal region is characterized as a drain region of a transistor.

16. A semiconductor device comprising:
a substrate including a device active area and a termination area;
a current terminal region, the current terminal region located in the device active area of the substrate and having a net conductivity doping profile of a first type and of a first concentration;
an insulator structure located at least partially in the termination area of the substrate, at least a portion of the insulator structure located in the substrate;
wherein the termination area includes semiconductor material having a net conductivity doping profile of the first type and at a second concentration that is less than the first concentration;
a guard structure, the guard structure including:

a guard region located in the termination area of the substrate between the current terminal region and the insulator structure, wherein the guard region has a net conductivity doping profile of a second type opposite the first type, wherein the semiconductor material having a net conductivity doping profile of the first type is located between the guard region and the insulator structure and between the guard region and the current terminal region;

a first floating field plate located over the termination area of the substrate at a first level, the first floating field plate being ohmically coupled to the guard region;

a second floating field plate located over the termination area of the substrate at a second level above the first level, the second floating field plate being ohmically coupled to the guard region, at least a portion of the second floating field plate vertically overlaps at least a portion of the first floating field plate;

wherein the current terminal region includes a finger-like portion having a distal end, wherein the guard region is located between the distal end of the current terminal region and the insulator structure.

17. The semiconductor device of claim 16 where in the semiconductor device includes a laterally diffused MOSFET and the current terminal region is characterized as a drain region.

18. A semiconductor device comprising:
a substrate including a device active area and a termination area;
a current terminal region located in the device active area of the substrate and having a net conductivity doping profile of a first type;
a guard structure in the termination area, the guard structure including:
a guard region located in the termination area of the substrate between the current terminal region and an area of a periphery of the termination area, wherein the guard region has a net conductivity doping profile of a second type opposite the first type, wherein semiconductor material having a net conductivity doping profile of the first type is located between the guard region and the area of the periphery of the termination area and between the guard region and the current terminal region;

a first floating field plate located over the termination area of the substrate at a first level, the first floating field plate being ohmically coupled to the guard region;

a second floating field plate located over the termination area of the substrate at a second level above the first level, the second floating field plate being ohmically coupled to the guard region, at least a portion of the second floating field plate vertically overlaps at least a portion of the first floating field plate;

wherein the first floating field plate includes a portion located directly over the semiconductor material having a net conductivity doping profile of the first type located between the guard region and the current terminal region.

19. The semiconductor device of claim 18 wherein the second floating field plate extends over the substrate closer to an area of the current terminal region than the first floating field plate.

20. The semiconductor device of claim 18 wherein the semiconductor material having a net conductivity doping profile of the first type is located over a first layer of semiconductor material having a net conductivity doping profile of the second type.

21. The semiconductor device of claim 18 wherein the current terminal region is characterized as a drain region of a transistor.

* * * * *